(12) United States Patent
Felber et al.

(10) Patent No.: US 9,076,709 B2
(45) Date of Patent: Jul. 7, 2015

(54) 3D CCD-STYLE IMAGING SENSOR WITH ROLLING READOUT

(75) Inventors: Jonas Felber, Niederbipp (CH);
Michael Lehmann, Winterthur (CH);
Bernhard Buettgen, Adliswil (CH)

(73) Assignee: MESA Imaging AG, Zurich (CH)

( * ) Notice: Subject to any disclaimer, the term of this patent is extended or adjusted under 35 U.S.C. 154(b) by 146 days.

(21) Appl. No.: 12/774,451

(22) Filed: May 5, 2010

(65) Prior Publication Data

US 2011/0114821 A1       May 19, 2011

Related U.S. Application Data

(60) Provisional application No. 61/175,528, filed on May 5, 2009.

(51) Int. Cl.
*H04N 3/14* (2006.01)
*H04N 5/335* (2011.01)
(Continued)

(52) U.S. Cl.
CPC .... *H01L 27/14812* (2013.01); *H01L 29/76841* (2013.01); *H01L 27/14825* (2013.01); *H01L 27/14831* (2013.01)

(58) Field of Classification Search
CPC ........ H04N 5/335; H04N 5/378; H04N 3/155
USPC ........ 250/208.1; 348/281, 282, 283, 302–304
See application file for complete search history.

(56) References Cited

U.S. PATENT DOCUMENTS 5,856,667 A    1/1999  Spirig et al.
6,995,795 B1*  2/2006  Losee et al. ................. 348/243

(Continued)

FOREIGN PATENT DOCUMENTS

DE    197 04 496 A1    3/1998
EP      1 624 490 A1    2/2006
(Continued)

OTHER PUBLICATIONS

Buettgen, B. et al., "CDD/CMOS Lock-In Pixel for Range Imaging: Challenges, Limitations and State-of-the-Art," 1st Range Imaging Days, ETH Zurich, 2005, 12 pages.

(Continued)

*Primary Examiner* — Renee D Chavez
(74) *Attorney, Agent, or Firm* — Fish & Richardson P.C.

(57) ABSTRACT

The presented readout structure provides charge transport based readout of a photosensitive device with a minimum number of transport gates. The structure uses the given charge storage buckets of the photosensitive device, separated by a minimum sized barrier-gate, to transport the charge out of the pixel field. This new readout schema allows for a fast readout speed based on a 2 phase transport chain and increases the pixel's optical fill factor by significantly reducing the transport gate size compared to state-of-the-art pixels using a 3 or 4 phase CCD readout chain. This readout structure can be exploited for standard photo-detecting elements such as e.g. pinned photo-diodes or any enhanced pixel structure that has additional intelligence incorporated as well. Typical applications are 2D- or 3D-imaging. The process used for manufacturing a sensor with such a readout scheme requires preferably charge transport mechanisms like charge-coupled gate devices as well as the possibility of integrating circuitries of high density. The exploitation of such a combination of process-related features results in a new sensor readout technique that allows for optimizing the pixel's dynamic range and optical fill factor.

18 Claims, 7 Drawing Sheets

(51) Int. Cl.
*H01L 27/148* (2006.01)
*H01L 29/768* (2006.01)

(56) References Cited

U.S. PATENT DOCUMENTS

| 7,884,310 | B2 | 2/2011 | Buettgen | |
|---|---|---|---|---|
| 2003/0184728 | A1* | 10/2003 | Levine et al. | 356/5.01 |
| 2010/0053405 | A1* | 3/2010 | Lehmann et al. | 348/311 |

FOREIGN PATENT DOCUMENTS

| EP | 1 777 747 A1 | 4/2007 |
|---|---|---|
| GB | 2 389 960 A | 12/2003 |
| WO | 2006/012761 A1 | 2/2006 |
| WO | 2007/045108 A1 | 4/2007 |

OTHER PUBLICATIONS

Buettgen, B. et al., "Demodulation Pixel Based on Static Drift Fields," IEEE Transactions on Electron Devices, vol. 53, No. 11, Nov. 2006, pp. 2741-2747.

Buettgen, B. "Extending Time-of-Flight Optical 3D-Imaging to Extreme Operating Conditions," Ph.D. Thesis, University of Neuchatel, 2006.

Holst, G. et al., "CMOS/CCD Sensors and Camera Systems," Second Edition, SPIE Press, 2007, pp. 45-89.

Lange, R., "3D Time-of-Flight Distance Measurement with Custom Solid-State Image Sensors in CMOS/CCD-Technology," Ph.D. Thesis, University of Siegen, 2000.

Oggier, T. et al., "An all-solid-state optical range camera for 3D real-time imaging with sub-centimeter depth resolution (SwissRanger TM)," Optical Design and Engineering, Proceedings of the SPIE, vol. 5249, 2004, pp. 534-545.

Seitz, P. et al., "Smart optical and image sensors fabricated with industrial CMOS/CCD semiconductor processes," SPIE, vol. 1900, pp. 21-30, 1993.

Ushinaga, T. et al., "A QVGA-size CMOS time-of-flight range image sensor with background light charge draining structure," Three-Dimensional Image Capture and Applications VII, Proceedings of SPIE, vol. 6056, Jan. 2006, pp. 605604-1 to 605604-8.

Van Nieuwenhove, D. et al., "Novel Standard CMOS Detector using Majority Current for guiding Photo-Generated Electrons towards Detecting Junctions," Proceedings Symposium IEEE/LEOS Benelux Chapter, 2005, pp. 229-232.

U.S. Appl. No. 61/092,548, filed Aug. 28, 2008, entitled "N-Tap Pixel for the Demodulation of Modulated Electromagnetic Wave Fields Based on Static Drift Fields," by Lehmann, M. et al.

* cited by examiner

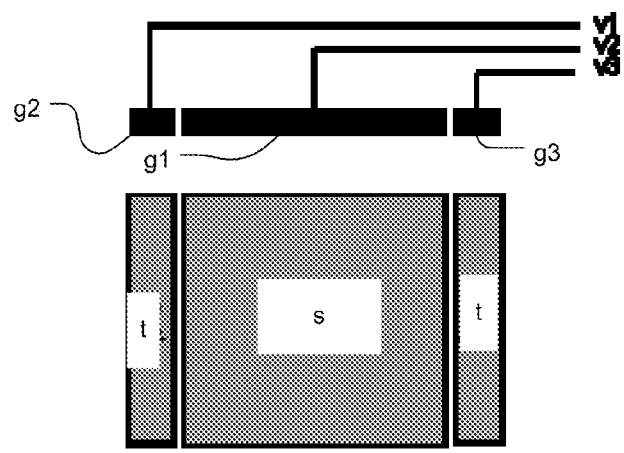
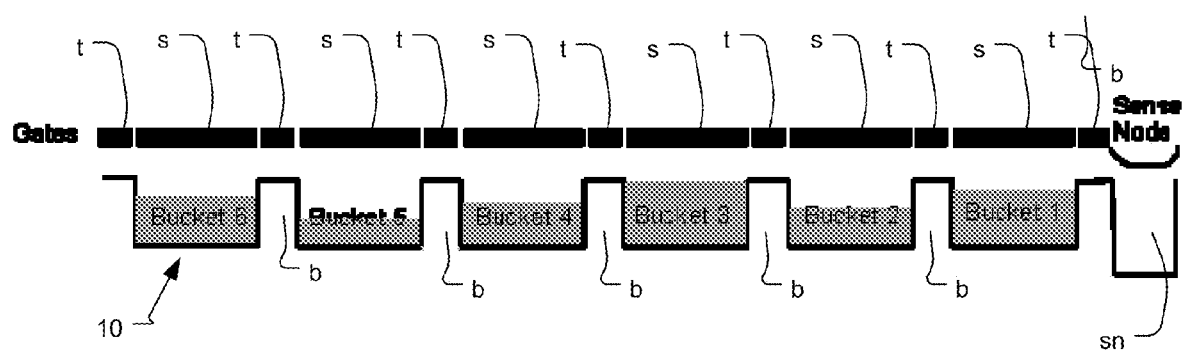
Fig. 1
Fig. 2

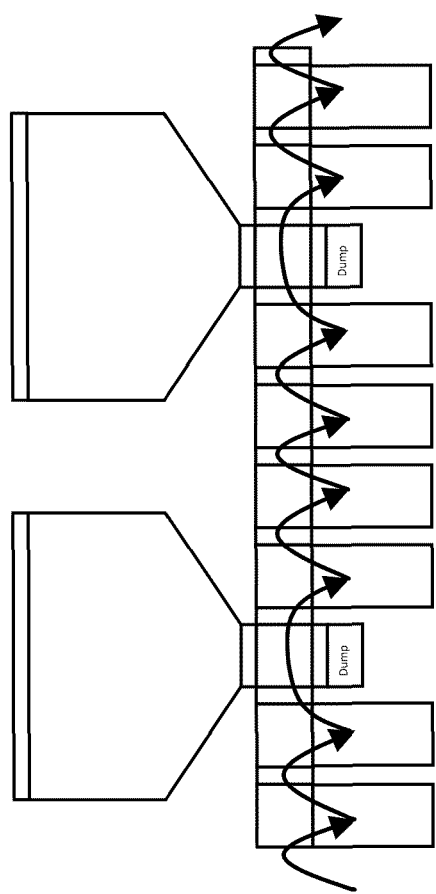

3D CCD-STYLE IMAGING SENSOR WITH ROLLING READOUT

RELATED APPLICATIONS

This application claims the benefit under 35 USC 119(e) of U.S. Provisional Application No. 61/175,528, filed on May 5, 2009, which is incorporated herein by reference in its entirety.

BACKGROUND OF THE INVENTION

Photo sensors comprising two-dimensional pixel fields can classified by their readout techniques. Active pixels are fabricated with complementary metal oxide semiconductors (CMOS) technology.

In a CMOS photo sensor, the charge-to-voltage conversion occurs inside each pixel. The photo signal is converted from electrons to a voltage. The signal is typically buffered by a source-follower transistor and is then transferred via select-switches to an output bus. The parallel column busses are connected via column buffer circuits to a multiplexer. There the signal is amplified and connected to the output.

The limitation of CMOS photo sensor is the conversion of the charge to a voltage. The pixel works in the voltage domain and is afflicted by noise of the readout circuit. The limited space in the pixel does not allow for low-noise circuitry.

A further limitation is the space needed by the output circuit in the pixel. Especially 3D imaging pixels with an arbitrary number of n output paths, a large proportion of chip real estate is claimed for the output circuit. Each storage area needs a separate output path with source follower and select-transistor. This consumes space and reduces the fill factor.

The advantage of CMOS devices is that one or more active transistors can be integrated into each of the pixels and thus the pixels become fully addressable. In contrast, charge coupled device (CCD) sensors use architectures in which charge carriers are transferred through storage cells to a sensor readout stage, just one dedicated for one sensor. The transport of the signal happens in the charge domain and therefore a high image quality with low noise is obtained.

In more detail, compared to CMOS sensors, the typical CCD sensor architecture has no active transistors in the pixel itself. The charge is moved laterally through the semiconductor, enforced by the voltage distribution applied to the CCD gate structure. Thus, the whole signal transport happens in the charge domain so that the signal is less distorted by noise than in a CMOS readout circuit or system.

A typical CCD architecture has three basic functions: 1) charge collection in the photo-sensitive area, 2) charge transfer through a CCD chain, and 3) the conversion of the charge in a measurable voltage (sense node and amplification).

The electrons are collected in the sensitive area of the pixel. After the integration period the signal is shifted to the readout register in the charge transfer step. This is used to transport the signal to the sense node typically at the border of the pixel field via a transport chain. The shift cycle happens depending on the architecture in 2 to 4 phases.

The sensitive area can be part of the transport chain itself but in most cases the pixel structure and the readout structure is separated. The CCD readout procedure can be distinguished by the number of phases needed for one shift to the next storage cell. There are 4 phase-, 3 phase and 2-phase CCD devices.

All known CCD transport chains suffer from the fact that one storage cell requires several gates that are large enough in order to store the full signal. This, however, limits the storage capacitance per storage cell significantly.

The CCD transport procedures are distinguished by the numbers of phase cycles they need for one charge shift from one pixel or storage element to the next.

In any case, the charge movement is realized by manipulating appropriately the gate voltages in such a way that the charge carriers can laterally follow the potential distribution into the direction of lowest energy without seeing any potential barrier. If the charge carriers to be collected are electrons, the point of lowest energy is at highest potential; and for holes it is the opposite.

Several smart pixel sensor developments made use of combined CCD/CMOS process technologies in the past. An overview of different smart sensor concepts in CCD/CMOS process technology is given by Seitz, et al ("Smart optical and image sensors fabricated with industrial CMOS/CCD semiconductor processes", in SPIE Vol. 1900, pp. 21-30, 1993). One major application field where combined CCD/CMOS processes are used is found in 3D time of flight (TOF) imaging. The specific requirements of those pixels are CCD transistors for high speed demodulation and the utilization of active CMOS transistors for the readout structure. This demands a CMOS process with an additional CCD option, which mainly consists of the feature of overlapping gates and a buried channel implantation. This combined or hybrid process can be used to implement advanced CCD readout structures.

SUMMARY OF THE INVENTION

In CCD sensors, the number of charge carriers, which are needed for a certain image quality, defines the minimum size of one storage cell. Furthermore, the maximum number of electrons that still needs to be stored is defined by the product of the dynamic range of the scene and the minimum number of electrons that is necessary for a minimum image quality. The maximum number of electrons is referred to as full well capacity.

Because of the fact that the charge cell must be at least separated by one gate and each gate must be able to store the maximum number of charge carriers, the transport chain has an effective used area of less or equal 30% for all types of known CCD readout schemes. This limitation is true for the transport register as well as for the pixel itself independent of the used charge shift procedure.

This means that two-thirds of the area of the pixel or transport chain is not used for storage. The presented invention gives a solution to increase significantly the storage capacitance and/or the optical fill factor of the pixel. By separating the storage buckets by minimum sized transfer gates, a much higher active area is achieved. This area can be used in favor of a higher fill factor or more storage capacitance. And still, the readout scheme allows a serial readout like for a common CCD readout structure.

The presented readout structure uses charge storage cells of a CCD sensor, which are preferably separated by a minimum-sized barrier-gate. The charge storage cells are used to transport the charge out of the two-dimensional pixel field. This charge transport structure allows for a fast readout speed due to a minimal number of shift cycles and increases the optical fill factor by reducing the number of transport gates. The reduced number of CCD stages in the CCD chain typically needs a more complex decoder, which can be integrated by exploiting the CMOS option.

In general according to one aspect, the invention features a photo sensor, comprising a two dimensional array of pixels, each pixel including a photo sensitive area including a drift field for transporting photo generated charges and readout chains for lines in the array for transporting the photo generated charges generated in each of the pixels out of the array.

In embodiments, the drift field is generated with a gates providing a static drift field. In other cases, the drift field is generated by a pinned photo diode. The readout chains each comprise a series of storage and transfer gates. A sense node is provided for each of the readout chains. A decoder controls the readout chains to laterally move an increasing number of separate charge packets over the course of reading out the chains.

In general according to one aspect, the invention features a photo sensor rolling readout method for a photo sensor comprising laterally moving an increasing number of separate charge packets over the course of reading out a chain of charge storage locations.

The above and other features of the invention including various novel details of construction and combinations of parts, and other advantages, will now be more particularly described with reference to the accompanying drawings and pointed out in the claims. It will be understood that the particular method and device embodying the invention are shown by way of illustration and not as a limitation of the invention. The principles and features of this invention may be employed in various and numerous embodiments without departing from the scope of the invention.

BRIEF DESCRIPTION OF THE DRAWINGS

In the accompanying drawings, reference characters refer to the same parts throughout the different views. The drawings are not necessarily to scale; emphasis has instead been placed upon illustrating the principles of the invention. Of the drawings:

FIG. 1 shows a CCD structure;

FIG. 2 is a schematic diagram showing a CCD transport chain;

FIGS. 7-9 show variations of a conveyor pixel with a rolling readout.

DETAILED DESCRIPTION OF THE PREFERRED EMBODIMENTS

The rolling CCD readout is based on the CCD structure shown in FIG. 1, in one embodiment. The minimal architecture has the following parts: a photo sensitive area/Charge carrier storage cell s, a first transfer cell t and a second transfer cell t. The potentials in the photo sensitive area/Charge carrier storage cell s, the first transfer cell t, and the second transfer cell t are controlled by respective voltages v2, v1, and v3 applied to respective gates g1, g2, g3

It is noted that the transfer gates t are not restricted to a single gate. In some embodiments it is reasonable to use transfer gates with more than one gate.

In contrast to prior-art CCD transport registers, the transfer cells/gates do not necessarily need to have the same size like the storage gates. The transfer gates are ideally minimally sized.

FIG. 2 shows a CCD transport chain 10. The basic structure shown in FIG. 1 is repeated several times. It includes a structure of CCD gates, where the charge storage gates s are separated by small transfer gates t. The charge storage gates s define respective photo sensitive areas/Charge carrier storage cells Bucket 6-Bucket 1 containing photo-generated charges. The transfer gates t define transfer cells or potential barriers b that separate the photo sensitive areas/Charge carrier storage cells. The chain ends in a sense node sn.

Figure 3:
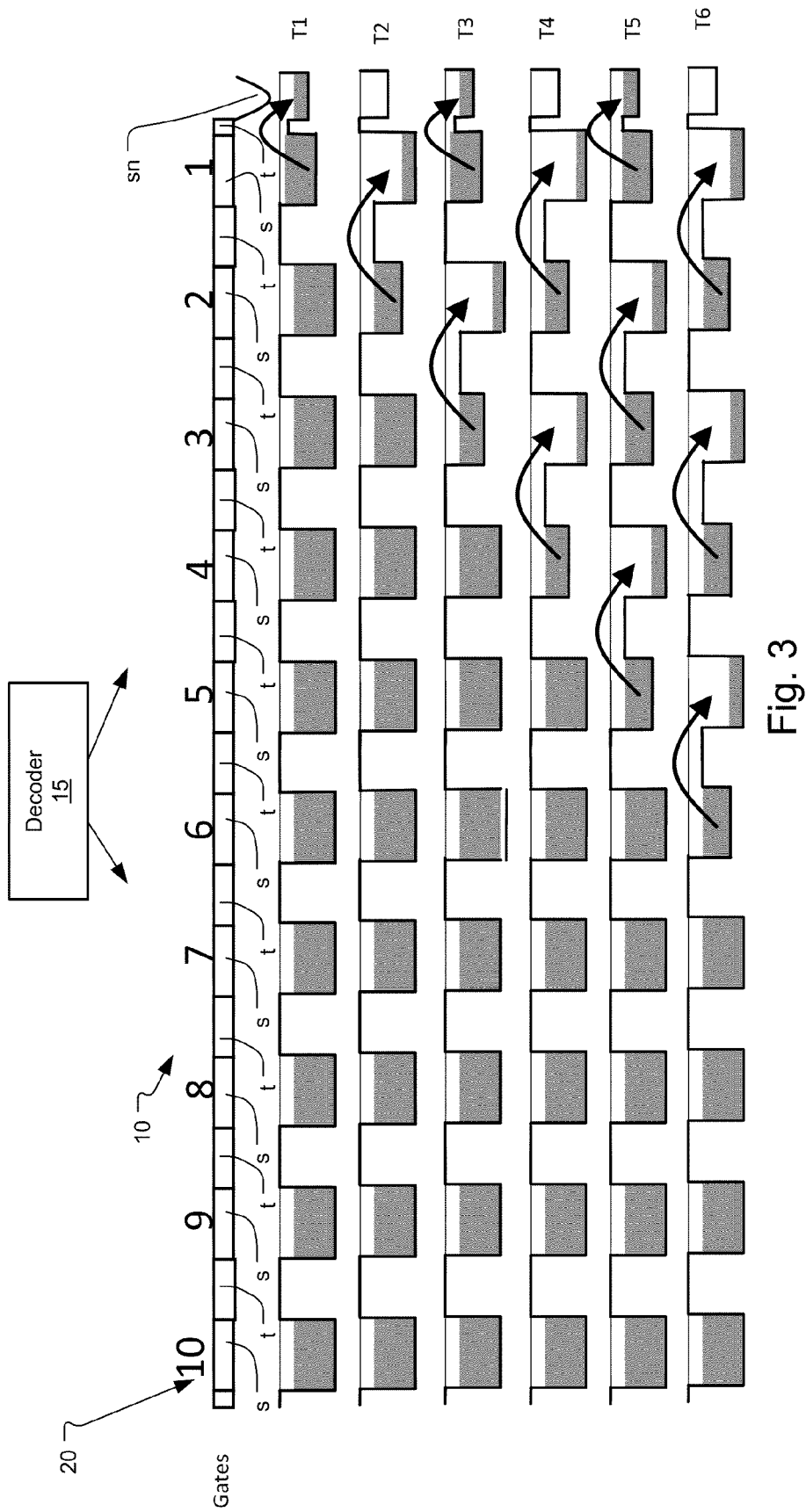
FIG. 3 shows a rolling charge readout system at different time intervals.

FIG. 3 shows the charge read out process rolling-wise. The readout process is controlled by a decoder 15 that controls the CCD chain 20 and specifically the voltages applied to the gates s, t. The process starts with the bucket next to the sense node (bucket 1). At the beginning of the readout cycle the sense node sn is reset. Afterwards the first charge bucket 1 is shifted over the transfer gate to the sense node sn in time T1 to deliver its charge packet. To do that the storage gate voltage applied to the storage gate s corresponding to cell or bucket 1 is continuously decreased to a lower voltage level so that the charge flows to the sense node sn. After having shifted all charges, bucket 1 is empty and the gate voltage is set back. Before the next shift cycle starts, the sense node sn is read out and reset.

This operation is repeated with the second storage gate 2 (bucket 2). The charge packet is first shifted over the transfer gate to the storage gate 1 (T2) and then to the sense node sn in the next step (T3). At the same time, the charge packet in the third charge bucket 3 is shifted to the second bucket 2. At every shift cycle the charge packet of one bucket more is shifted so that every second shift-cycle an image value is ready for readout in the sense node sn.

This procedure is repeated by the decoder 15 until all the charge packets have been shifted out of the pixels. The number of shift cycles needed is twice the number of pixels in a column. If the pixels are implemented in an array, the columns are shifted in parallel.

Each shift of charge packet requires also the slight increase of the potential of the transfer gates t in order to avoid any charge carrier flow into the wrong lateral direction.

The rolling readout for CCD devices has some significant gains compared to the prior-art readout schemes. In summary those are:

The rolling CCD readout increases the fill factor and/or the storage capacity by using the storage gates itself for charge transport. No additional storage structures are needed for the charge transport in the pixel.

Small transfer gates are possible. The transfer gate does not need to have anymore the size of the storage gate and it is as small as the technology allows.

High readout speed: the readout speed is given by a two phase cycle, meaning a reduction just by a factor of 2 compared to conventional CCD readouts but profiting by the mentioned benefits at the same time.

The pixel structure is simple. The number of gates in the pixel itself is reduced and the number of signal paths through the pixel field is smaller.

The charge transport happens in the charge domain. No noise is added to the signal i.e. caused by transistors.

Compared to CMOS readout, no transistors are used in the pixel. The mismatch between the pixels is reduced because the column uses the same amplifier. The size of the amplifier and thus its quality is not limited by the pixel size and therefore an advanced, low noise amplifier can be used at the end of each column.

One application of a rolling CCD readout are demodulating pixels in the field of 3D time of flight (TOF) imaging and fluorescence life-time imaging (FLIM). By demodulating the optical signal and applying the discrete Fourier analysis on the samples acquired, parameters such as amplitude and phase can be extracted for the frequencies of interest. If the optical signal is sinusoidally modulated, the extraction based on at least four discrete samples will lead to the offset, amplitude and phase information. The phase value corresponds proportionally to the sought distance value in TOF applications. Such a harmonic modulation scheme is often used in real-time 3-D imaging systems incorporating the demodulation pixels.

Common to all pixels is the necessary transfer of charges through the photo-sensitive detection region to a subsequent storage area or to a subsequent processing unit. In the case of charge-domain based pixel architectures, the photo-charge is generally transferred to a storage node. In order to demodulate an optical signal, the pixel has to contain at least two integration nodes that are accumulating the photo-generated charges during certain time intervals.

The trend of 3D imaging pixels is going into the direction of integrating n>=3 storage nodes per pixel. A typical method for realizing a fast readout is to integrate a separate output path for each storage node, so that all n output samples can be read out in parallel. This means the integration of n source followers, n select transistors and n reset transistors in every pixel. The problem here is that the pixel's optical fill factor gets smaller when integrating a larger number of storage nodes and output paths, which, in turn, decreases significantly the sensitivity of the pixel. Smaller CMOS process technology can help to mitigate the pixel's performance decrease. However, the new readout scheme provides an enhanced solution for optimizing the pixel's fill factor because all the source follower, select and reset transistors in the pixel become obsolete and can be omitted; and the readout speed is reduced just by a fix factor of 2.

The described embodiments also have applicability to the field of 2D imagers. The significant increases in the pixel's fill factor and/or the pixel's storage capacitance are useful in some system despite the reduction of the readout speed by 2.

3D-Imaging Pixels

A few embodiments are shown below in the following sections, where the focus is set on 3D-imaging pixels. However, it does not mean that these are all possible pixel designs based on the embodiments disclosed herein. These examples do not restrict the pixel concept to other design approaches.

Conveyor Pixels

The working principle of the pixel is explained on the basis of a 4-tap architecture, which is a specific implementation of this pixel concept which is more fully described in U.S. Pat. Publ. No. US 2010-0053405 A1, which is incorporated herein in its entirety by this reference.

Figure 4:
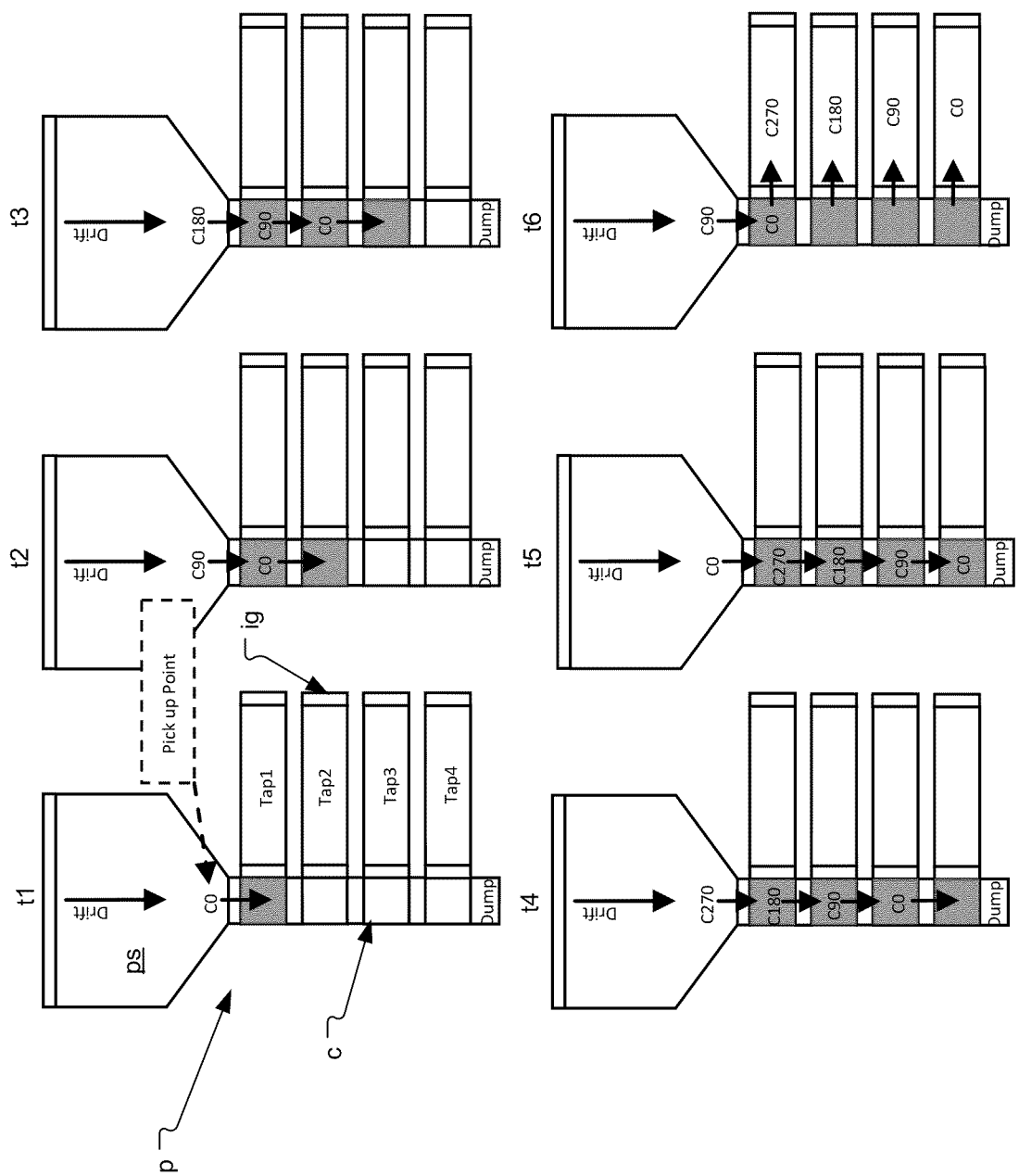
FIG. 4 is a schematic diagram showing a 4-tap conveyor pixel at six time periods t1-t6.

FIG. 4 shows this so-called 4-tap conveyor pixel p at six time periods t1-t6. If the pixel is used to sample a sinusoidally modulated light signal at four time points each separated by pi/2, the two upper integration gates correspond to the samples at phases 270 and 180 degrees and the bottom integration gates correspond to the samples at 90 and 0 degrees. A dump node is preferably designed at the lower end of the CCD chain.

During the sampling of the optical signal, all photo-generated charge generated in photosensitive area ps drifts to the pick-up point forced by the lateral electrical drift field (drift). This lateral field is generated with a series of gates of different voltages and/or a pinned photo diode and/or minority current, to name a few options, When the sampling time is finished, the charge is transferred into the CCD pixel chain c by CCD register operation. Then, the next charge package is sampled. After each sampling step the charge packets in the CCD chain are shifted further. The CCD chain might be implemented e.g. as 3-Gate CCD structure or as 4-Gate CCD structure.

After the fourth sampling (t5), four charge packets C0, C90, C180, C270 are within the CCD chain c. In order to store them, they are shifted to the integration gates ig dedicated to the particular signal phases. The whole 4-tap sampling is repeated several times and the charge carriers are accumulated within the integration gates ig in order to increase the signal-to-noise ratio of the charge packets.

Figure 5:
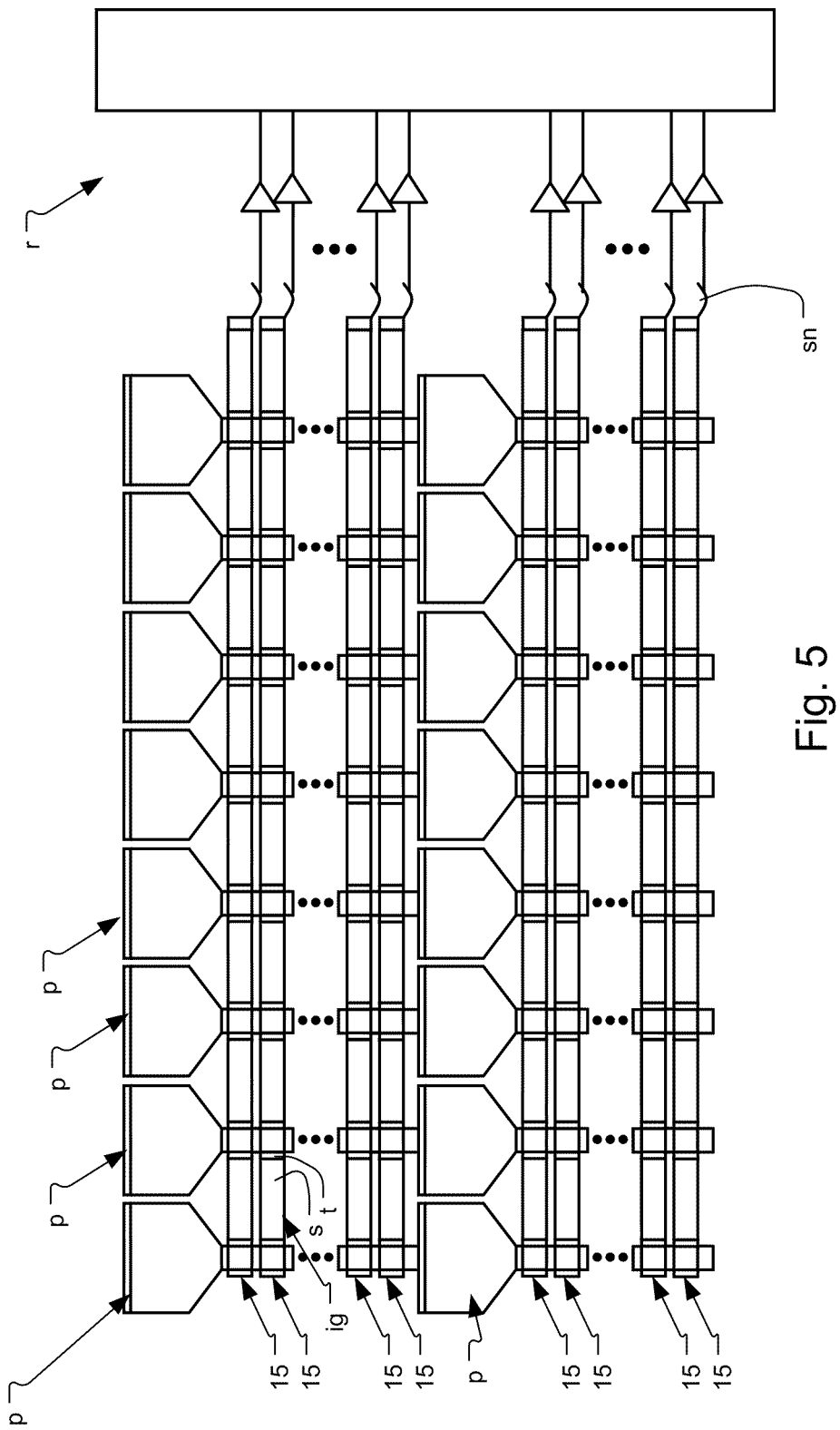
FIG. 5 is a schematic diagram showing a conveyor pixel array in a rolling readout chain.

FIG. 5 shows a conveyor pixel array with n-taps that is comprised of conveyor pixels p. The pixels p are so close to each other that the integration gates ig touch the next pixel p. It accrues a CCD readout chain 15 where the storage gates s are separated with transfer gates t. The charge is now shifted from one pixel to the next by using the storage gates s in the chains 15 to the sense nodes and then readout by readout system r.

Figure 6:
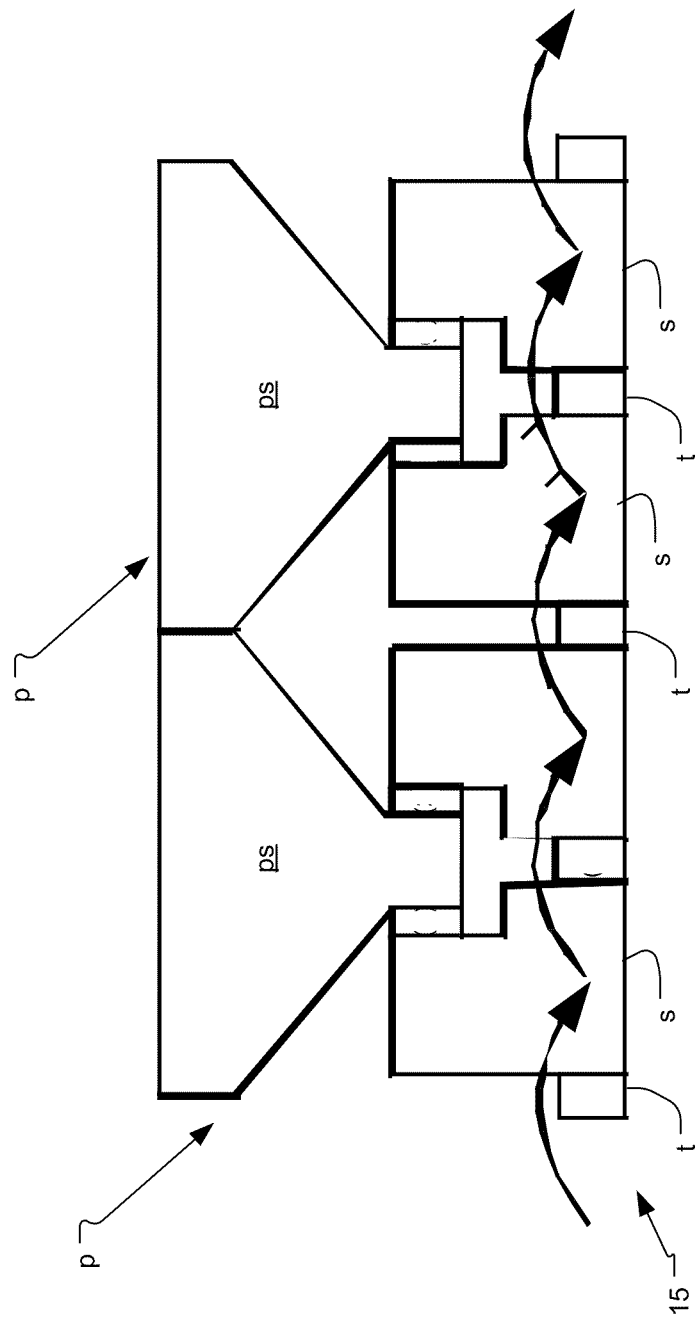
FIG. 6 is a schematic diagram showing the drift field pixel in a rolling readout chain.

FIG. 6 shows the drift field pixel as described in WO 2007/2007-045108 A1, which is incorporated herein in its entirety. The pixels p are integrated into a readout chain 15 in which the storage gates are located on both sides.

Figure 8:
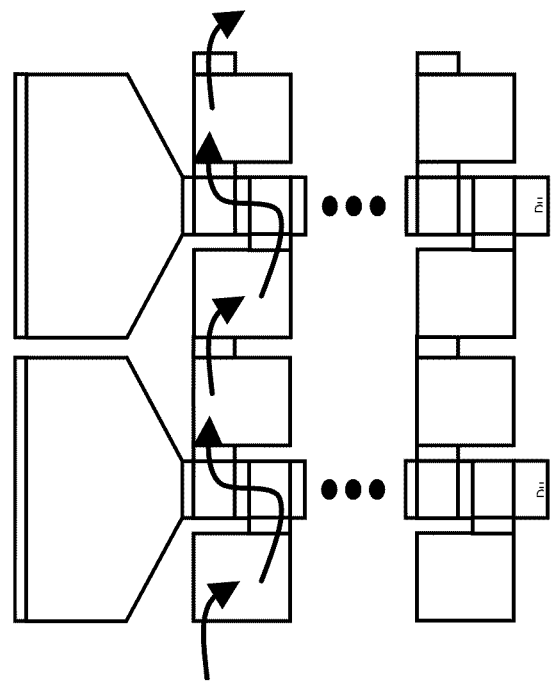
Figure 7:
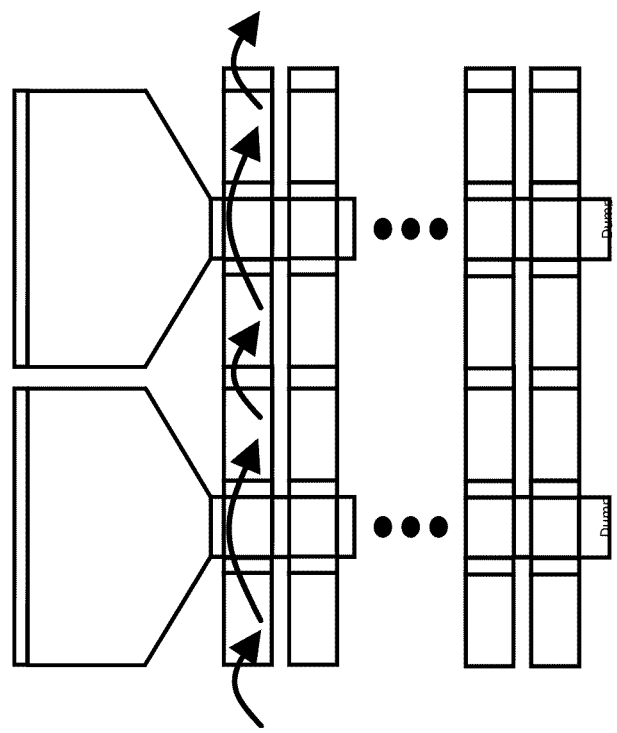

FIGS. 7-9 show further variations of the conveyor pixel as described in US 2010-0053405 A1 but using a rolling readout FIG. 7 shows an N-tap conveyor pixel with rolling CCD readout in which the storage gates are alternately located on both sides.

FIG. 8 shows 4-tap pixel with rolling CCD readout in which the storage gates are alternately located on both sides.

FIG. 9 shows 4-tap pixel with rolling CCD readout with rolling CCD readout; the charge samples can be moved on both sides.

In summary, the presented readout structure uses the charge storage buckets or cells of a photo-gate device, separated by a minimum sized transfer gate, to transport the charge out of the pixel field. This charge transport structure allows for a fast readout speed due to the minimized number of shift cycles and increases the fill factor and/or storage capacitance by reducing the size and number of the transfer gates. However the reduced number of transfer gates in the gate chain necessitates a more complex decoder to control the readout procedure. The implementation of the rolling CCD readout is preferably processed in technology that provides charge coupled gate structures as well as a high integration density. Combined standard CCD/CMOS processes do provide such a feature and are preferably used.

While this invention has been particularly shown and described with references to preferred embodiments thereof, it will be understood by those skilled in the art that various changes in form and details may be made therein without departing from the scope of the invention encompassed by the appended claims.

What is claimed is:

1. A photo sensor, comprising:
a two dimensional array of pixels, each of the pixels including a photo sensitive area including a drift field for transporting photo generated charges, and at least two pixel storage gates that alternately receive the photo generated charges from the photo sensitive area to sample at different phases; and
readout chains formed from the pixel storage gates for the pixels for lines in the array, the readout chains enabling the photo generated charges to be passed between the pixel storage gate for successive pixels through the lines; and
a decoder for controlling the readout chains to transport the photo generated charges generated in each of the pixels out of the array by successively shifting the photo generated charges for each of the pixels through the readout chains and laterally out of the array, wherein the decoder controls the chains to laterally move an increasing number of separate charge packets in a particular shift cycle relative to a prior shift cycle during reading out of the chains.

2. A photo sensor as claimed in claim 1, wherein the drift field is generated with gates providing a static drift field.

3. A photo sensor as claimed in claim 1, wherein the drift field is generated by a pinned photo diode.

4. A photo sensor as claimed in claim 1, wherein the readout chains each comprise a series of storage and transfer gates.

5. A photo sensor as claimed in claim 1, further comprising a sense node for each of the readout chains.

6. The photo sensor as claimed in claim 1 wherein the decoder is operable to shift the photo generated charges in a two-phase cycle such that a respective one of the charge packets is ready for readout at a sense node only every second shift cycle.

7. The photo sensor of claim 6 wherein, over the course of reading out the chains, the decoder controls the chains to:
move a first number of separate charge packets laterally during a particular shift cycle,
move a second number of separate charge packets laterally during a subsequent shift cycle, the second number being greater than the first number, and
move a third number of separate charge packets laterally during a further subsequent shift cycle, the third number being greater than the second number.

8. A method of operation for a photo sensor, comprising:
in a two dimensional array of pixels, providing each of the pixels with a photo sensitive area including a drift field for transporting photo generated charges, and at least two pixel storage gates that alternately receive the photo generated charges from the photo sensitive area to sample at different phases; and
transporting the photo generated charges generated in each of the pixels out of the array in readout chains formed from the pixel storage gates for the pixels for lines in the array by successively shifting the photo generated charges for each of the pixels through the pixel storage gate for successive pixels in the chains through the readout chains and laterally out of the array, wherein successively shifting the photo generated charges includes performing a plurality of shift cycles during which an increasing number of separate charge packets are moved laterally in each readout chain in successive shift cycles.

9. A method as claimed in claim 8, wherein the drift field is generated with a gates providing a static drift field.

10. A method as claimed in claim 8, wherein the drift field is generated by a pinned photo diode.

11. A method as claimed in claim 8, wherein the readout chains each comprise a series of storage and transfer gates.

12. A method as claimed in claim 8, further comprising a sense node for each of the readout chains.

13. The method of claim 8 wherein the photo generated charges are shifted such that a respective one of the charge packets is ready for readout at a sense node only every second shift cycle.

14. The method of claim 8 including:
moving a first number of separate charge packets laterally in a particular chain during a first shift cycle,
moving a second number of separate charge packets laterally in the particular chain during a subsequent second shift cycle, the second number being greater than the first number, and
moving a third number of separate charge packets laterally in the particular chain during a further subsequent third shift cycle, the third number being greater than the second number.

15. A rolling readout method for a photo sensor, comprising:
in a two dimensional array of pixels, providing each pixel with a photo sensitive area including a drift field for transporting photo generated charges to create charge packets that are accumulated in charge storage locations, in which each of the pixels comprises at least two charge storage locations that alternately receive the photo generated charges to sample at different phases;
laterally moving an increasing number of separate charge packets between the pixel storage locations for successive pixels over the course of reading out a chain of charge storage locations laterally out of the array under the control of a decoder.

16. The rolling readout method of claim 15 wherein laterally moving an increasing number of separate charge packets includes plurality of shift cycles, and wherein the photo generated charges are shifted in a two-phase cycle such that a respective one of the charge packets is ready for readout at a sense node every second shift cycle.

17. A photo sensor, comprising:
a two dimensional array of pixels, each of the pixels including a photo sensitive area including a drift field for transporting photo generated charges, and at least two pixel storage gates that receive the photo generated charges from the photo sensitive area to alternatively sample at different phases; and
readout chains formed from the at least two pixel storage gates for the pixels for lines in the array, the readout chains enabling the photo generated charges to be passed between the pixel storage gates for successive pixels through the lines so that the photo generated charges are passed from pixel to pixel through the lines until the photo generated charges reach a readout system at an end of lines; and
a decoder for controlling the readout chains to transport the photo generated charges generated in each of the pixels out of the array by successively shifting the photo generated charges for each of the pixels through the readout chains and laterally out of the array, wherein the decoder controls the chains to laterally move an increasing number of separate charge packets during one shift cycle relative to another shift cycle during read out the chains.

18. The photo sensor as claimed in claim 17 wherein the decoder is operable to shift the photo generated charges in a two-phase cycle such that a respective one of the charge packets is ready for readout at a sense node only every second shift cycle.

* * * * *